United States Patent
Hung et al.

(10) Patent No.: US 9,733,577 B2
(45) Date of Patent: Aug. 15, 2017

(54) INTRA-FIELD PROCESS CONTROL FOR LITHOGRAPHY

(71) Applicant: Taiwan Semiconductor Manufacturing Co., Ltd., Hsin-Chu (TW)

(72) Inventors: Ai-Jen Hung, Zhushan Township (TW); Chen-Yen Huang, Jhunan Township (TW); Shin-Rung Lu, Chu-Pei (TW); Yen-Di Tsen, Chung-Ho (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 13 days.

(21) Appl. No.: 14/844,438

(22) Filed: Sep. 3, 2015

(65) Prior Publication Data
US 2017/0068169 A1    Mar. 9, 2017

(51) Int. Cl.
*G03F 7/20*    (2006.01)

(52) U.S. Cl.
CPC ...... *G03F 7/70616* (2013.01); *G03F 7/70141* (2013.01)

(58) Field of Classification Search
None
See application file for complete search history.

(56) References Cited

U.S. PATENT DOCUMENTS

| | | | |
|---|---|---|---|
| 5,912,983 A * | 6/1999 | Hiratsuka | G06T 7/0024 382/144 |
| 7,291,569 B2 | 11/2007 | Goodwin et al. | |
| 7,948,607 B2 | 5/2011 | Warrick et al. | |
| 8,279,402 B2 | 10/2012 | Six et al. | |
| 8,318,607 B2 | 11/2012 | Rathsack et al. | |
| 8,947,630 B2 | 2/2015 | Padiy et al. | |
| 2002/0111038 A1* | 8/2002 | Matsumoto | G03F 7/70458 438/763 |
| 2003/0223630 A1* | 12/2003 | Adel | G03F 7/705 382/145 |
| 2004/0126004 A1* | 7/2004 | Kikuchi | G03F 9/7003 382/141 |
| 2007/0052940 A1* | 3/2007 | Zaal | G03F 7/70341 355/53 |
| 2008/0198351 A1 | 8/2008 | Lin et al. | |

(Continued)

*Primary Examiner* — Steven H Whitesell Gordon
(74) *Attorney, Agent, or Firm* — Eschweiler & Potashnik, LLC

(57) ABSTRACT

In some embodiments, the present application is directed to a method and system for process control of a lithography tool. The method transfers a reference pattern to exposure fields of a reference workpiece to form pairs of overlapping reference layers. Misalignment between the overlapping reference layers is measured to form first and second baseline maps, and a Δ baseline map is formed from the first and second baseline maps. A production pattern is transferred to exposure fields of a production workpiece to form second production layers arranged over and aligned to first production layers. Misalignment between the first and second production layers is measured to form a production map. The Δ baseline map is transformed and subsequently added to the production map, to form a final production map. Parameters of a process tool are updated based on the final production map.

20 Claims, 6 Drawing Sheets

(56) References Cited

U.S. PATENT DOCUMENTS

2013/0230797 A1 9/2013 Van Der Sanden et al.
2014/0111779 A1* 4/2014 Chen .................. G03F 7/70633
                                                                        355/27

* cited by examiner

INTRA-FIELD PROCESS CONTROL FOR LITHOGRAPHY

BACKGROUND

During the manufacture of integrated circuits (ICs), multi-step sequences of semiconductor manufacturing processes are performed to gradually form electronic circuits on workpieces. One such semiconductor manufacturing process is photolithography. Photolithography is a process for transferring a pattern from a reticle to a workpiece using radiation (e.g., light).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
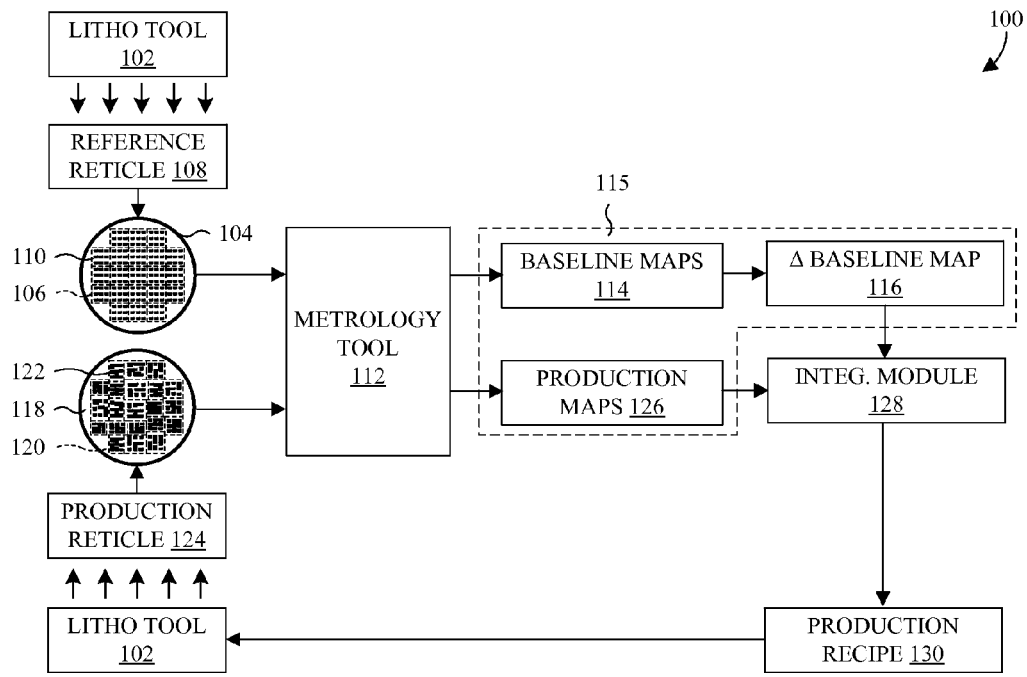
FIG. 1 illustrates a schematic view of some embodiments of a lithography system for providing intra-field process control.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Immersion lithography is a photolithography resolution enhancement technique that replaces a typical air gap between a final lens and a workpiece with a liquid medium that has a refractive index greater than 1. Replacing the air gap with a liquid medium increases the resolution by a factor proportional to the refractive index of the liquid. An immersion lithography scanner generally includes an illumination means, an exposure slit, a lens or reticle and a liquid medium that propagates light from the lens to a workpiece, such as a semiconductor wafer. The lens and the workpiece typically move relative to each other and form exposure fields on the workpiece. Generally, a field covers an exposure area of a workpiece that corresponds to a single integrated circuit or die. A plurality of exposure areas and fields are utilized for a single workpiece.

Lithography systems or scanners are designed to repeatedly transfer the reticle pattern to a workpiece at specific tolerances. However, lithography scanner characteristics typically change over time causing intra-field drift to occur. The intra-field changes cause exposure fields to undesirably alter adjacent exposure fields. For non-immersion lithography scanners, the drift occurs slowly. However, immersion lithography scanners are highly susceptible to drift, which can produce patterns that are out of tolerance and result in defective integrated circuits. Therefore, if the patterns do not meet specifications, rework is typically needed. Rework involves measuring the produced patterns and determining if they meet specifications. If they do not, the photoresist or radiation sensitive material needs to be removed, reapplied and re-exposed. Unfortunately, rework is a costly and time consuming process.

Furthermore, immersion lithography scanners are initially calibrated using reference wafers prior to production. The calibration adjusts characteristics of the scanners to compensate for tool variations and to generate expected results. However, when the scanners are used in production, other wafer sizes may be used. These other wafer sizes are referred to as production wafer sizes. The production wafer sizes vary from the reference wafer sizes and, as a result, further variations in produced patterns can result.

In some embodiments, the present application is directed to a method and a system for intra-field process control of a lithography tool. In some embodiments, a reference pattern is repeatedly transferred to exposure fields of a reference workpiece to form pairs of overlapping reference layers. Misalignment between the overlapping reference layers is measured to form first and second baseline maps. A difference between the first and second baseline maps is determined to form a Δ baseline map. A production pattern is individually transferred to exposure fields of a production workpiece to form second production layers arranged over and aligned to first production layers. Misalignment between the first and second production layers is measured to form a production map. Exposure fields of the Δ baseline map are individually transformed to corresponding exposure fields of the production map, and subsequently added to the production map, to form a final production map. Parameters of a process tool are updated based on the final production map. The method and the system for intra-field process control reduce intra-field variation due to drift and calibration. By reducing intra-field variation, rework is reduced, which reduces costs and increases throughput.

FIG. 1 illustrates some embodiments of a disclosed lithography system 100 for providing intra-field process control.

The lithography system 100 comprises a lithography tool 102 configured to generate radiation. In some embodiments, the lithography tool 102 may be configured to output ultraviolet radiation (e.g., having wavelength of approximately 193 nm). In some embodiments, the lithography tool 102 may be an immersion lithography tool. The lithography tool 102 is configured to expose one or more reference workpieces 104 according to a reference reticle 108 to form a plurality of reference exposure fields 106 on the reference workpiece(s) 104. The plurality of exposure fields comprise pairs 110 of reference layers individual to the reference exposure fields 106. The pairs 110 of reference layers comprise first reference layers patterned according to a first reference pattern and second reference layers, which are patterned according to a second reference pattern and arranged over and aligned to the first reference layers.

The lithography tool 102 is further configured to expose one or more production workpieces 118 according to a production reticle 124 to form a plurality of production exposure fields 120 on the production workpiece(s) 118. The production workpiece(s) 118 may have different sizes than the reference workpiece(s) 104 and the production exposure fields 120 may, have varying sizes and/or shapes different than those of the reference exposure fields 106. The production exposure fields 120 comprise pairs 122 of production layers having first production layers patterned according to a first reference pattern, and second production layers patterned according to a second reference pattern and arranged over and aligned to the first production layers.

A metrology tool 112 is configured to operate upon the reference workpiece(s) 104 to measure misalignment between the pairs 110 of reference layers. From the measurements, baseline maps 114 are formed. The baseline maps 114 correspond to different times, and describe misalignment between the first and second reference layers, as a function of location on the reference workpiece(s) 104. Based on the baseline maps 114, a Δ baseline map 116 is generated. The Δ baseline map 116 is a map of a change in misalignment from a first baseline map to a second baseline map. In some embodiments, the baseline maps 114, and the Δ baseline map 116 may be stored in a memory element 115. In various embodiments, the memory element 115 may comprise RAM (e.g., SRAM, DDRAM, etc.), ROM, EEPROM, flash memory, optical storage, or other medium which can be used to electronically store information.

The metrology tool 112 is also configured to operate upon the production workpiece(s) 120 to measure misalignment of the pairs 122 of production layers to form a production map 126. The production map 126 describes misalignment between the first and second production layers, as a function of location on the resulting production workpiece(s) 118. In some embodiments, the production map 126 may also be stored in the memory element 115 or in a separate memory element.

An integration module 128 receives the Δ baseline map 118 and a most recent production map, and integrates the Δ baseline map 118 with the production map 126. Exposure fields of the Δ baseline map 116 are individually transformed to match corresponding exposure fields of the production map 126, since the reference exposure fields 106 and the production exposure fields 120 may have different shapes and/or sizes. The transformed exposure fields are then added to corresponding exposure fields of the production map 126 to form a final production map. Based upon the final production map, the integration module generates a production recipe 130 correcting for misalignment described by the final production map. In some embodiments, the integration module 128 may comprise one or more processing units.

The production recipe 130 comprises corrections for process parameters of the lithography tool 102 that advantageously correct for intra-field variation from drift and/or calibration. In some embodiments, the corrections are individual to exposure fields of the final production map so as to correct for intra-field variation from drift and/or calibration within the individual exposure fields.

After generating the production recipe 130, the lithography tool 102 may use the production recipe 130 to form additional production and/or reference layers. Further, in some embodiments where the production recipe 130 comprises corrections individual to exposure fields of the final production map, the lithography tool 102 may switch between corrections depending upon the exposure field to which a layer is currently being transferred.

Figure 2:
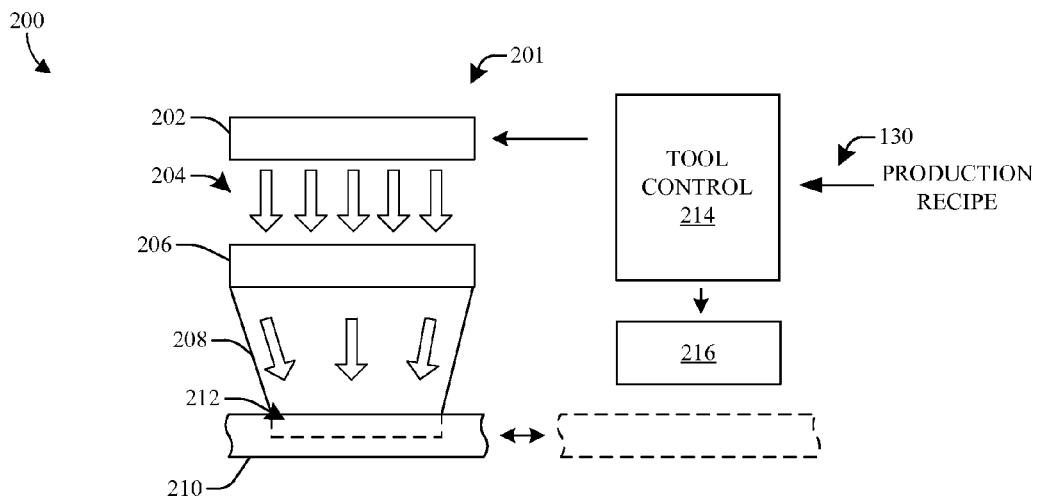
FIG. 2 illustrates a schematic view of some embodiments of a lithography tool configured to provide for intra-field process control.

FIG. 2 is a diagram illustrating an immersion lithography system 200 using a modified production recipe that accounts for tool drift and calibration variations.

The immersion lithography system 200 comprises an immersion lithography scanning tool 201 configured to perform immersion lithography processes on a semiconductor workpiece 210. The immersion lithography scanning tool 201 includes an illumination mechanism 202, a reticle 206, and a liquid medium 208. The illumination mechanism 202 controllably generates radiation 204 directed towards the workpiece 210. The radiation 204 passes through the liquid medium 208, which is substantially in contact with a portion of the semiconductor workpiece 210. The liquid medium 208 scales the pattern prior to it reaching and impinging an exposure field 212 on the workpiece 210. Generally, the liquid medium 208 has a refractive index greater than 1. In one example the liquid medium 208 has a high refractive index between about 1.5 and 1.8. The pattern applied by the lens 226 is reduced by the liquid medium, for example, by 4×, 5×, or otherwise.

The immersion lithography system 200 may further comprise a spin coating module 216 configured to provide a photosensitive material (e.g., photoresist) onto the workpiece prior to being provided to the immersion lithography scanning tool 201.

A control unit 214 is configured to receive a production recipe 130 and to control operating parameters of the immersion lithography scanning tool 201 and/or the spin coating module 216 based on the production recipe 130. In various embodiments, the operating parameters may comprise radiation intensity, exposure duration, type of radiation sensitive material, mask images, etc.

Figure 3:
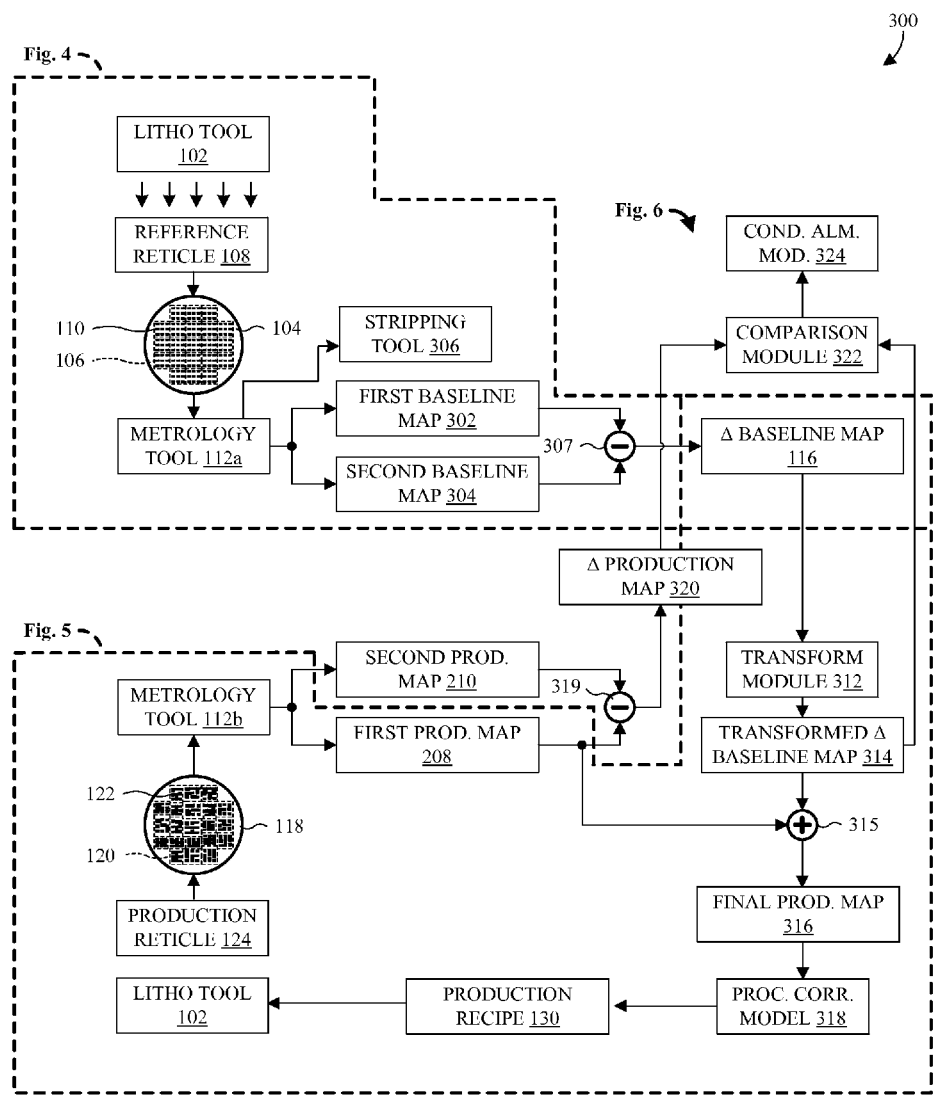
FIG. 3 illustrates a schematic view of more detailed embodiments of a lithography system for providing intra-field process control.

With reference to FIG. 3, a schematic view 300 of some more detailed embodiments of a method for controlling intra-field variation in a lithography tool 102 is provided.

As illustrated, a reference workpiece 104 is provided to the lithography tool 102. In some embodiments, the reference workpiece 104 may, for example, be a semiconductor wafer. The reference workpiece 104 comprises a plurality of reference exposure fields 106 arranged on a frontside of the reference workpiece 104. The reference exposure fields 106 correspond to different areas of the reference workpiece 104 to be individually exposed to patterned radiation.

The lithography tool 102 is associated with one or more reference reticles 108 comprising a first reference pattern of features and a second reference pattern of features. In some embodiments, the first and second reference patterns may be the same. Further, the reference features may, for example, be uniformly distributed across the reference reticle(s) 108, and/or may be line, square, or rectangle shaped.

At the lithography tool 102, the first reference pattern is individually transferred to the reference exposure fields 106 to form first reference layers patterned according to the first reference pattern. Subsequently, the second reference pattern is individually transferred to the reference exposure fields 106 to form second reference layers patterned according to the second reference pattern, over and aligned to the first reference layers. A reference pattern may, for example, be transferred to the reference exposure fields 106 by forming a photosensitive layer over the reference exposure fields 106, passing radiation through a reference reticle 108 to pattern the photosensitive layer according to the reference pattern, and developing the photosensitive layer.

The transfer results in a reference workpiece 104 comprising pairs 110 of reference layers individual to the reference exposure fields 106. The pairs 110 of reference layers comprise corresponding first reference layers patterned according to the first reference pattern. Further, the pairs 110 of reference layers comprise corresponding second reference layers patterned according to the second reference pattern, and arranged over and aligned to the first reference layers.

A first metrology tool 112a receives the resulting reference workpiece 104 and measures misalignment of the pairs 110 of reference layers. For example, supposing the first and second reference patterns are the same, lateral displacements between corresponding reference features in the first and second reference layers may be measured. Based on the measurements, the metrology tool 112a forms and/or updates a first or second baseline map 302, 304. The baseline map 302, 304 describes misalignment between the first and second reference layers, as a function of location on the frontside of the resulting reference workpiece 104.

After the first and/or second baseline maps 302, 304 are formed and/or updated, a Δ baseline map 116 is calculated as a change in misalignment from the first baseline map 302 to the second baseline map 304. The Δ baseline map 116 may be calculated by subtracting the first baseline map 302 from the second baseline map 304 using a first subtraction module 307.

In some embodiments, the first baseline map 302 may be formed immediately after preventative maintenance (PM) was last performed on the lithography tool 102 and the second baseline map 304 may be formed before PM is performed again. For example, the first baseline map 302 may be formed after PM is performed on the lithography tool 102, and the second baseline map 304 may be formed a every few days layer (e.g., three days later). PM is typically performed on the lithography tool 102 every few months, such as about every three months. In other embodiments, the first baseline map 302 may be formed before PM and the second baseline map 304 may be formed after PM. Furthermore, the first or second baseline map 302, 304 and the Δ baseline map 116 may be periodically updated. For example, after forming the first or second baseline map 302, 304, a stripping tool 306 removes the first and second reference layers. The foregoing process then repeats to update the first or second baseline maps 302, 304.

A production workpiece 118 is also provided to the lithography tool 102. The production workpiece 118 may, for example, be a semiconductor wafer upon which one or more layers are formed. The production workpiece 118 comprises one or more first production layers 122 arranged on a frontside of the production workpiece 118 in a plurality of production exposure fields 120. The first production layer(s) 122 comprise one or more first production patterns of features, such as, for example, metal lines or pads and/or transistor gates. The production exposure fields 120 correspond to different areas of the production workpiece 118 to be individually exposed to patterned radiation. Further, in some embodiments, the production exposure fields 120 correspond to the reference exposure fields 106 on a one-to-one basis, and/or to integrated circuit (IC) die.

The lithography tool 102 is configured to transfer the second production pattern(s) to the production exposure fields 120, which are over and aligned to the first production layers, to form second production layers patterned according to the pattern(s). A production pattern may, for example, be transferred to a production exposure field 120 by forming a photosensitive layer over the production exposure field 120, passing radiation through a production reticle 124 to pattern the radiation according to the production pattern, focusing the patterned radiation on the production exposure field 120, and developing the photosensitive layer.

The transfers result in production workpieces 118 comprising pairs 122 of production layers individual to the production exposure fields 120. The pairs 122 of production layers comprise corresponding first production layers. Further, the pairs 122 of production layers comprise corresponding second production layers patterned according to the second production pattern(s), and arranged over and aligned to the first production layers.

A second metrology tool 112b receives the resulting production workpiece 118 and measures the misalignment of the pairs 122 of production layers (e.g., lateral displacement between production layers). Based on the measurements, the metrology tool 112b forms a first or second production map 308, 310. The production map 308, 310 describes misalignment between the first and second production layers 124, as a function of location on the frontside of the resulting production workpiece 118. In some embodiments, the first and second metrology tools 112a, 112b are the same.

The Δ baseline map 116 is transformed by a transform module 312 so reference exposure fields 106 of the Δ baseline map 116 match corresponding production exposure fields 120 in the first production map 308. In some embodiments, the transformation employs image registration to individually register the reference exposure fields 106 to the corresponding production exposure fields 120. The image registration may, for example, scale the individual reference exposure fields 106 to sizes of the corresponding production exposure fields 120.

A transformed Δ baseline map 314 passes to an addition module 315, where the transformed Δ baseline map 314 is added to the first production map 308 to form a final production map 316. In some embodiments, the addition is performed by adding corresponding displacement vectors in the first production map 308 and the transformed Δ baseline map 314.

The final production map 316 passes to a process correction model 318 to form a production recipe 130 correcting for misalignment described by the final production map 316. In some embodiments, the process correction model 318 includes the transform module 312 and/or the addition module 315. The production maps, 308 and 310, and the production recipe 130 may be periodically updated. For example, a new production map may be formed every few times a production pattern is transferred to a production workpiece. As another example, a new production recipe may be formed whenever newer production maps and/or Δ baseline maps become available.

The production recipe 130 describes corrections for process parameters of the lithography tool 102 that correct for misalignment described in the final production map 316. The process parameters are parameters of the lithography tool 102 that are variable during use of the lithography tool 102 and that control how the lithography tool 102 performs a process. Examples of the process parameters include, for example, type of radiation sensitive material or photoresist to use, mask images, radiation intensity, duration, tolerance values and the like. The corrections may be absolute values for the process parameters (i.e., replacements to existing values), or Δ values for the process parameters (i.e., changes to existing values). Further, in some embodiments, the corrections are individual to exposure fields of the final production map 316 to individually correct misalignment for the exposure fields 120.

The production recipe 130 is subsequently used by the lithography tool 102 for the subsequent transfer of patterns to workpieces. Further, the production recipe 130 is periodically updated when new production maps and/or baseline maps are formed.

In some embodiments, the system may be configured to perform a verification of the production recipe 130. In such embodiments, a Δ production map 320 is calculated as a change in misalignment from the first production map 308 to the second production map 310. The Δ production map 320 may be calculated by subtracting the first production map 308 from the second production map 310 using a second subtraction module 319. The Δ production map 320 and the transformed Δ baseline map 314 are then compared by a comparison module 322 to quantify differences. Based on the comparison, a conditional alarm module 324 may generate an alarm and/or halt processing by the lithography tool 102 if predetermined criteria are met. The predetermined criteria may, for example, include the magnitude of a quantified difference exceeding a threshold.

It will be appreciated that in various embodiments, the modules described herein, for example in relation to FIGS. 1 and 3 (e.g., modules 128, 312, 307, 315, 316, 318, 319, 322, 324, etc.), may be implemented by hardware and, in some embodiments, software configured to carry out the corresponding functionality. For example, the modules may include a field-programmable gate array (FPGA) or some other circuit. Further, to the extent that the modules include software, the software is stored by a memory unit and executed by one or more processing units. The processing unit(s) may comprise, for example, a microcontroller, a microprocessor, or an application-specific integrated circuit (ASIC) configured to execute the software from the memory unit(s).

Figure 4:
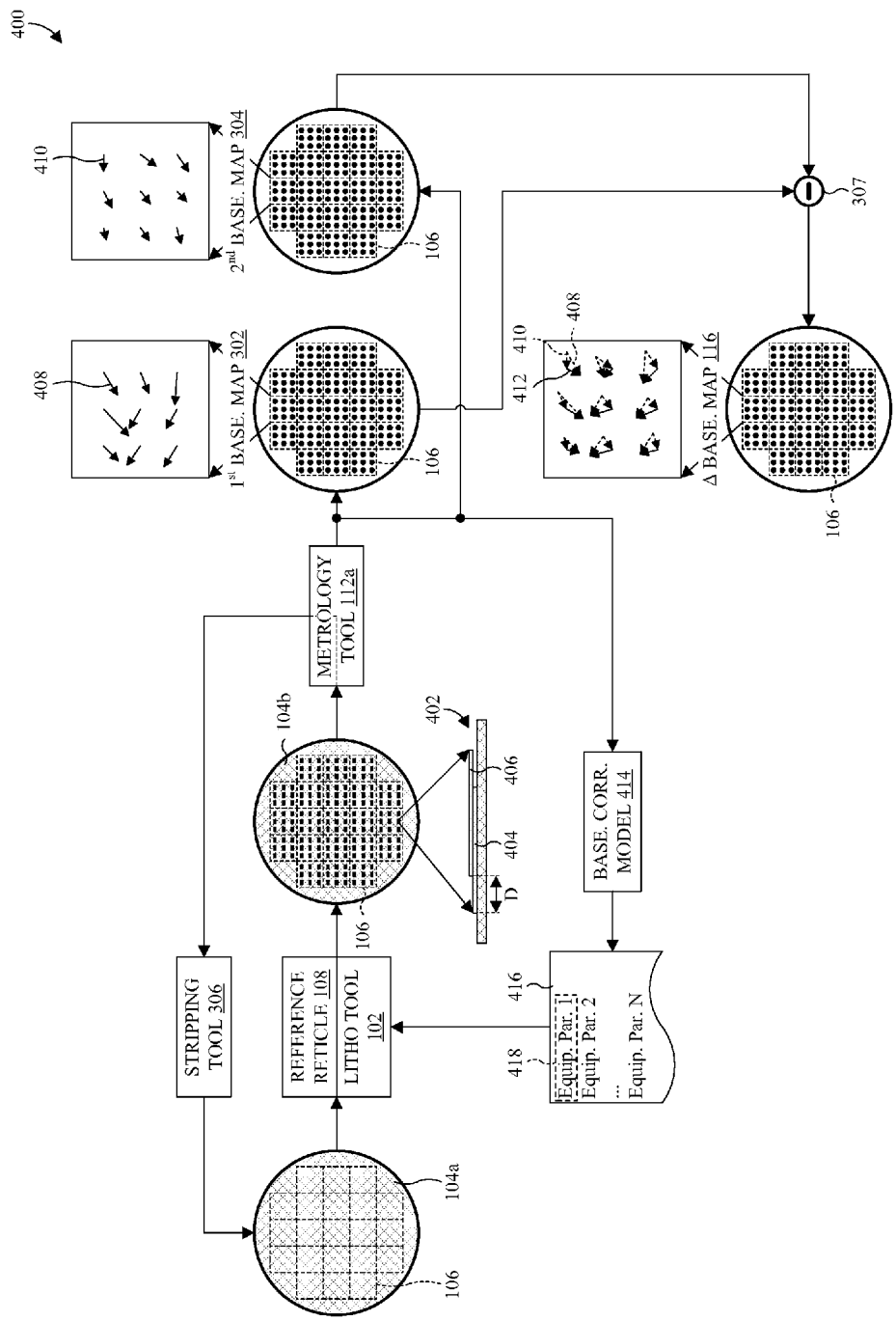
FIG. 4 illustrates a schematic view of some embodiments of a method for generating a Δ baseline map.

With reference to FIG. 4, a schematic view 400 of some embodiments of a method for generating a Δ baseline map is provided.

As illustrated, a lithography tool 102 individually transfers a first reference pattern to reference exposure fields 106 on a frontside of a reference workpiece 104a using one or more reference reticles 108 to form first reference layers. Further, the lithography tool 102 individually transfers a second reference pattern to the reference exposure fields 106 using the reference reticle(s) 108 to form second reference layers arranged over and aligned with the first reference layers. In some embodiments, the first and second reference patterns are the same.

A resulting reference workpiece 104b comprises pairs 402 of features distributed across a frontside of the resulting reference workpiece 104b. The pairs 402 of features comprise corresponding first reference features 404 in the first reference layers, and further comprise corresponding second reference features 406 in the second reference layers. Due to drift and/or calibration variation, the first and second reference features 404, 406 may be misaligned. For example, first and second reference features 404, 406 of a pair 402 may be laterally displaced by a distance D.

A metrology tool 112a receives the resulting reference workpiece 104b and measures misalignment of the pairs 402 of features on the resulting reference workpiece 104b. Based on the measurements, the metrology tool 112a forms and/or updates a first or second baseline map 302, 304. The baseline map 302, 304 describes misalignment (e.g., lateral displacement) between the first and second reference features 404, 406, as a function of location on the frontside of the resulting reference workpiece 104b. In some embodiments, a baseline map 302, 304 maps spatial locations on the frontside of the resulting reference workpiece 104b to corresponding displacement vectors 408, 410. The displacement vectors 408, 410 describe the lateral displacement between the first and second reference features 404, 406 at the corresponding spatial locations.

After forming and/or updating the first or second baseline map 302, 304, a stripping tool 306 removes or otherwise strips the first and second reference layers from the resulting reference workpiece 104b, and the foregoing process repeats to again form and/or update a first or second baseline map 302, 304.

When the first and/or second baseline maps 302, 304 are formed and/or updated, a Δ baseline map 116 is calculated as a change in misalignment from the first baseline map 302 to the second baseline map 304. The Δ baseline map 116 may be calculated by subtracting the first baseline map 302 form the second baseline map 304 using a first subtraction module 307. In some embodiments, as illustrated, the subtraction is accomplished using vector subtraction. For example, a first vector 408 of the first baseline map 302 may be subtracted from a corresponding second vector 410 of the second baseline map 304 to form Δ baseline vector 412.

In some embodiments, when the first and/or second baseline maps 302, 304 are formed and/or updated, a baseline correction model 414 may be employed to form a baseline recipe 416. The baseline recipe 416 comprises values 418 for equipment parameters of the lithography tool 102 that restore the lithography tool 102 to a baseline. Equipment parameters are typically not variable during use of the lithography tool 102, and include, for example, wet etchant concentration and optical focus. The baseline recipe 416 is subsequently used by the lithography tool 102 for the subsequent transfers of patterns to workpieces.

Figure 5:
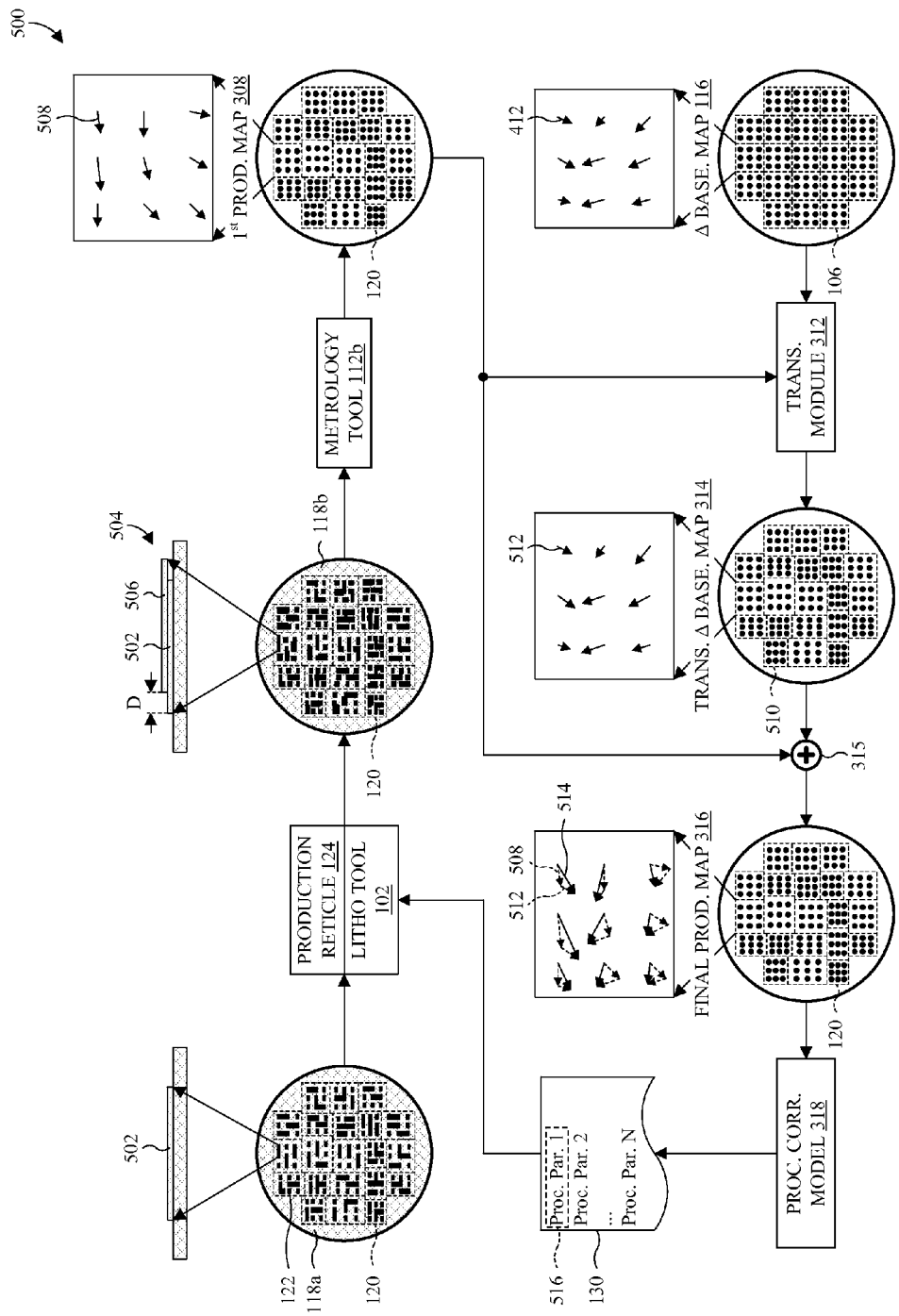
FIG. 5 illustrates a schematic view of some embodiments of a method for generating a production recipe.

With reference to FIG. 5, a schematic view 500 of some embodiments of a method for generating a production recipe is provided.

As illustrated, a production workpiece 118a comprising a plurality of first production features 502 is provided to a lithography tool 102. The first production features 502 are distributed over a frontside of the production workpiece 118a, within a plurality of production exposure fields 120, and collectively define first production layers 122 patterned according to a first production pattern. The lithography tool 102 transfers one or more second production patterns to the production exposure fields 120 using one or more production reticles 124 to form second production layers arranged over and aligned with the first production layers 122.

A resulting production workpiece 118b comprises pairs 504 of production features distributed across a frontside of the resulting production workpiece 118b, typically with multiple pairs 504 per exposure field 120. The pairs 504 of production features comprise corresponding first production features 502 in the first production layers 122, and further comprise corresponding second features 506 in the second production layers. Due to drift and/or calibration variation, the first and second production features 502, 504 may be misaligned. For example, first and second production features 502, 506 of a pair 504 may be laterally displaced by a distance D.

A metrology tool 112b receives the resulting production workpiece 118b and measures misalignment of the pairs 504 of features on the resulting workpiece 118b. Based on the measurements, the metrology tool 112b forms and/or updates a first or second production map 308. The production map 308 describes misalignment between the first and second production features 502, 504, as a function of location on the frontside of the resulting production workpiece 118b. In some embodiments, a production map 308 maps spatial locations on the frontside of the resulting reference workpiece 118b to corresponding displacement vectors 508. The displacement vectors 508 describe the lateral displacement between the first and second production features 502, 506 at the corresponding spatial locations.

After forming and/or updating the first or second production map 308, the foregoing process repeats again with another production workpiece and/or different production patterns to form and/or update a first or second production map 308.

When the first production map 308 and/or a Δ baseline map 116 are formed and/or updated, the Δ baseline map 116 is transformed by a transform module 312 to match the first production map 308. Namely, since the exposure fields 106, 120 of the Δ baseline map 116 and the first production map 308 may have different sizes and shapes, the reference exposure fields 106 of the Δ baseline map 116 are individually transformed to match corresponding production exposure fields 120 of the first production map 308.

The transforming includes applying transformations (e.g., scaling transformations) to shapes and/or sizes of the reference exposure field 106 of the Δ baseline map 116 so as to match shapes and/or sizes of the corresponding reference exposure fields 106. Further, the transforming includes applying the same transformations to the misalignment measurements (e.g., lateral displacement vectors). In some embodiments, the transforming employs image registration to individually register the reference exposure fields 106 to the corresponding production exposure fields 120.

A transformed Δ baseline map 314 comprising transformed exposure fields 510, including transformed misalignment measurements 512, is added to the first production map 308 by an addition module 315. The addition results in a final production map 317. In some embodiments, as illustrated, the addition is accomplished using vector addition. For example, a first vector 508 of the first production map 308 may be added to a corresponding second vector 512 of the transformed Δ baseline map 314 to form a final production vector 514.

The final production map 316 passes to a process correction model 318, where it is transformed to a production recipe 130. The production recipe 130 describes corrections 516 to process parameters of the lithography tool 102 that correct for misalignment described in the final production map 316. The corrections 516 may be absolute values for the process parameters (i.e., replacements to existing values), or Δ values for the process parameters (i.e., changes to existing values). While the corrections 516 can be global across the production exposure fields 120, in some embodiments, the corrections 516 are individual to the production exposure fields 120 to individually correct misalignment for the production exposure fields 120.

The production recipe 130 is subsequently used by the lithography tool 102 for the transfer of patterns to workpieces. Further, the production recipe 130 is periodically updated when new production maps and/or baseline maps are formed. In some embodiments where the production recipe 130 includes corrections per exposure field, the lithography tool 102 is configured to switch between the correction parameters based on exposure field.

Figure 6:
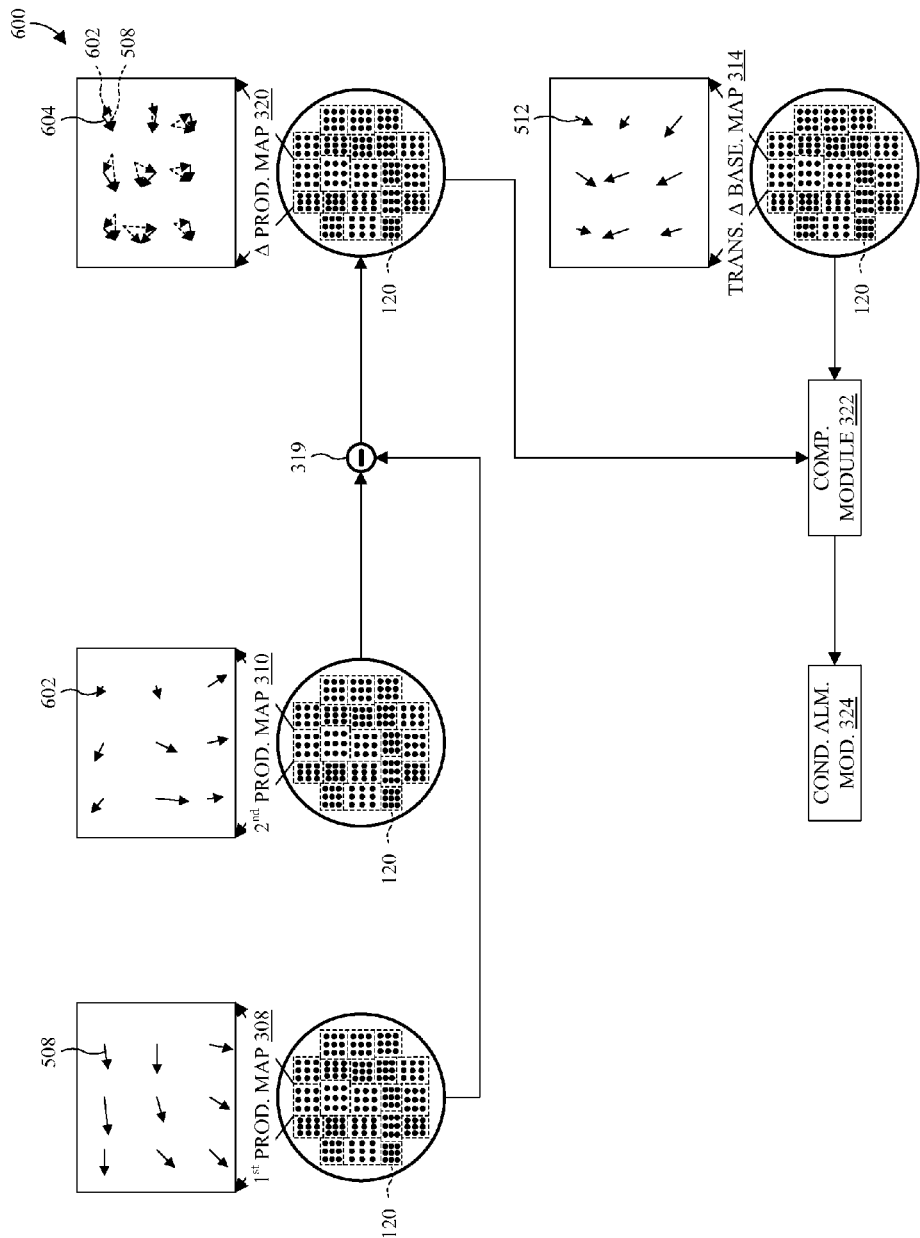
FIG. 6 illustrates a schematic view of some embodiments of a method for verifying a final production map.

With reference to FIG. 6, a schematic view 600 of some embodiments of a method for verifying a final production map is provided.

As illustrated, first and second production maps 308, 310 are provided. The first and second production maps 308, 310 describe misalignment between layers on frontsides of production workpieces, as a function of location across the frontsides. For example, the first and second maps 308, 310 may map spatial locations on the frontsides to corresponding displacement vectors 508, 602 between the layers. In some embodiments, the first production map 308 is formed using a metrology tool immediately after PM was last performed on a lithography tool, whereas the second production map is formed thereafter by the metrology tool, before PM is performed again.

With the first and second production maps 308, 310, the first production map 308 is subtracted from the second production map 310 by a second subtraction module 319 to form a Δ production map 318. In some embodiments, as illustrated, the subtraction is accomplished using vector subtraction. For example, a first vector 508 of the first production map 308 may be subtracted from a corresponding second vector 602 of the first production map 310 to form a Δ production vector 604.

The Δ production map 320 is compared to a transformed Δ baseline map 314 by a comparison module 322 to quantify differences between the Δ production map 320 and the transformed Δ baseline map 314. Ideally, the Δ production map 320 and the transformed Δ baseline map 314 would match. However, in practice, there will be differences due to, among other things, errors forming the transformed Δ baseline map 314.

In some embodiments, the differences between the Δ production map 320 and the transformed Δ baseline map 314 are quantified by determining a difference between each displacement vector in the Δ production map 320 and a corresponding displacement vector in the transformed Δ baseline map 314. The differences may then be summed, and the summation may be divided by the number of differences.

Based on the comparison, a conditional alarm module 324 generates an alarm if certain criteria are met. For example, the conditional alarm module 324 compares the quantified differences to thresholds and generates an alarm if the thresholds are exceeded. Processing of workpieces may also be halted so as to allow technicians to investigate and, where appropriate, correct the cause of the alarm.

Figure 7:
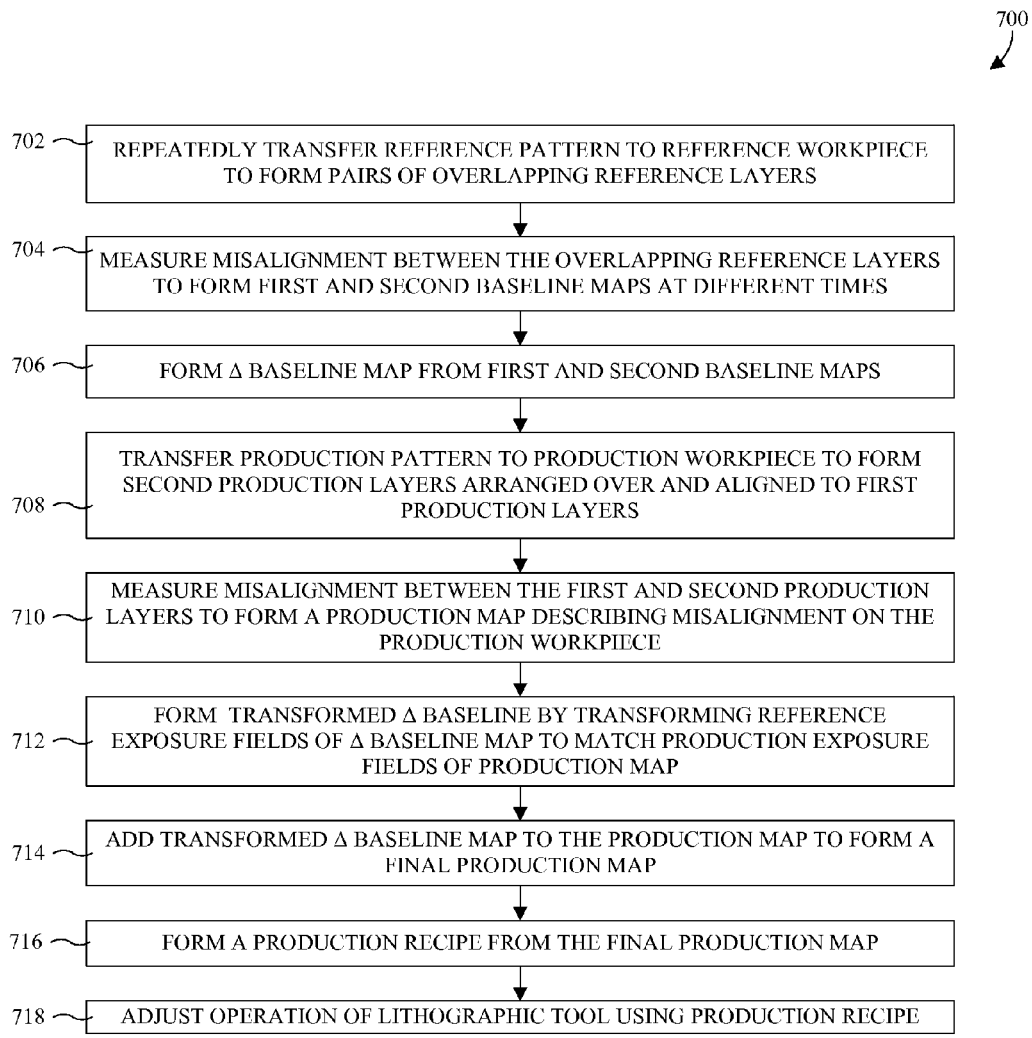
FIG. 7 illustrates a block diagram of some embodiments of a method for intra-field process control of a lithography tool.

With reference to FIG. 7, a block diagram 700 of some embodiments of a method for intra-field process control of a lithography tool is provided.

At 702, a reference pattern is repeatedly and individually transferred to reference exposure fields of a reference workpiece using a lithography tool to form pairs of overlapping reference layers patterned according to the reference pattern.

At 704, misalignment between the overlapping reference layers is measured to form first and second baseline maps at different times. The first and second baseline maps describe misalignment as a function of location on the reference workpiece.

At 706, a Δ baseline map is formed from the first and second baseline maps. In some embodiments, a difference between the first and second baseline maps is determined to form a Δ baseline map.

At 708, a production pattern is individually transferred to production exposure fields of a production workpiece using the lithography tool to form second production layers patterned according to the production pattern, and arranged over and aligned to corresponding first production layers.

At 710, misalignment between the first and second production layers is measured to form a production map describing misalignment as a function of location on the production workpiece.

At 712, reference exposure fields of the Δ baseline map are individually transformed to match corresponding production exposure fields of the production map to form a transformed Δ baseline map.

At 714, the transformed Δ baseline map is added to the production map to form a final production map.

At 716, a production recipe is formed from the final production map using a process correction model. The production recipe comprises corrections for process parameters of a process tool that correct for misalignment.

At 718, the lithographic tool is used with the production recipe.

While the disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Therefore, the present disclosure is directed to a method and system for process control of a lithography tool.

In some embodiments, the present disclosure relates to a method for intra-field process control of a lithography tool. The method comprises receiving first and second baseline maps describing misalignment of pairs of reference features distributed across a reference workpiece, as a function of location on the reference workpiece. The method further comprises determining a Δ baseline map as a difference between the first and second baseline maps. The method further comprises receiving a production map describing misalignment of pairs of production features distributed across a production workpiece, as a function of location on the production workpiece. The method further comprises individually transforming exposure fields of the Δ baseline map to corresponding exposure fields of the production map, and subsequently adding the transformed exposure fields to the production map, to form a final production map. The method further comprises updating parameters of a lithography tool based on the final production map.

In other embodiments, the present disclosure relates to a system for intra-field process control of a lithography tool. The system comprises one or more memory elements configured to store first and second baseline maps describing misalignment of pairs of reference features distributed across a reference workpiece, as a function of location on the reference workpiece, and further configured to store a production map describing misalignment between pairs of production features distributed across a production workpiece, as a function of location on the production workpiece. The system further comprises a subtraction module configured to determine a Δ baseline map as a difference between the first and second baseline maps. The system further comprises an integration module configured to integrated the Δ baseline map with the production map to form a final production map, wherein the integration module is configured to integrate the Δ baseline map with the production map by individually transforming exposure fields of the Δ baseline map to corresponding exposure fields of the production map, and subsequently adding the transformed exposure fields to the production map. The system further comprises a model configured to update parameters of a lithography tool based on the final production map.

In yet other embodiments, the present disclosure relates to a method for intra-field process control of a lithography tool. The method comprises transferring a reference pattern to exposure fields of a reference workpiece to form pairs of overlapping reference layers patterned according to the reference pattern, and measuring misalignment between the overlapping reference layers to form first and second baseline maps. The method further comprises determining a Δ baseline map as a difference between the first and second baseline maps. The method further comprises transferring a production pattern to exposure fields of a production workpiece to form second production layers patterned according to the production pattern, and arranged over and aligned to corresponding first production layers. The method further comprises measuring misalignment between the first and second production layers to form a production map. The method further comprises individually transforming exposure fields of the Δ baseline map to corresponding exposure fields of the production map, and subsequently adding the transformed exposure fields to the production map, to form a final production map, and updating parameters of a lithography tool based on the final production map.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for intra-field process control of a lithography tool, the method comprising:
  receiving first and second baseline maps respectively describing misalignment of same pairs of reference features distributed across a reference workpiece, as a function of location on the reference workpiece;
  determining a Δ baseline map as a difference between the first and second baseline maps;
  receiving a production map describing misalignment of pairs of production features distributed across a production workpiece, as a function of location on the production workpiece;
  individually transforming exposure fields of the Δ baseline map to corresponding exposure fields of the production map, and subsequently adding the transformed exposure fields to the production map, to form a final production map; and updating parameters of a lithography tool based on the final production map.

2. The method according to claim 1, further comprising:
transferring a reference pattern to exposure fields of the reference workpiece using the lithography tool to form the same pairs of reference features;
measuring misalignment of the same pairs of reference features to form the first and second baseline maps;
transferring a production pattern to exposure fields of the production workpiece using the lithography tool to form the pairs of production features; and
measuring misalignment of the pairs of production features to form the production map.

3. The method according to claim 2, further comprising:
transferring the reference and production patterns respectively to the reference and production workpieces using immersion lithography.

4. The method according to claim 1, further comprising:
measuring lateral displacements between the reference features of the same pairs of reference features; and
forming the first or second baseline map mapping locations of the pairs of reference features to the lateral displacements.

5. The method according to claim 1, wherein individually transforming the exposure fields of the Δ baseline map comprises:
scaling a size and shape of the exposure fields of the Δ baseline map to match a size and shape of the corresponding exposure fields of the production map.

6. The method according to claim 1, further comprising:
forming the final production map mapping locations on the production workpiece to corresponding displacement vectors of misalignment between pairs of features;
forming a production recipe that comprises corrections for the parameters that correct for misalignment described by the final production map; and
updating the parameters with the production recipe.

7. The method according to claim 6, further comprising:
forming the production recipe comprising individual corrections for exposure fields of the final production map.

8. The method according to claim 1, further comprising:
forming the first baseline map immediately after performing preventive maintenance (PM) on the lithography tool;
forming the second baseline map after forming the first baseline map, before performing PM again on the lithography tool; and
forming the production map immediately after performing PM on the lithography tool.

9. The method according to claim 1, further comprising:
forming the production map immediately after performing PM on the lithography tool;
forming an additional production map after forming the production map, before performing PM again on the lithography tool;
determining a Δ production map as a difference between the production map and the additional production map;
comparing the Δ production map to a transformed Δ baseline map comprising the transformed exposure fields; and
conditionally generating an alarm based on the comparing.

10. A system for intra-field process control of a lithography tool, the system comprising:
one or more memory elements configured to store first and second baseline maps describing misalignment of pairs of reference features distributed across a reference workpiece, as a function of location on the reference workpiece, and further configured to store a production map describing misalignment between pairs of production features distributed across a production workpiece, as a function of location on the production workpiece;
a subtraction module configured to determine a Δ baseline map as a difference between the first and second baseline maps;
an integration module configured to integrated the Δ baseline map with the production map to form a final production map, wherein the integration module is configured to integrate the Δ baseline map with the production map by individually transforming exposure fields of the Δ baseline map to corresponding exposure fields of the production map, and subsequently adding the transformed exposure fields to the production map, wherein individually transforming the exposure fields of the Δ baseline map comprises scaling a size and shape of the exposure fields of the Δ baseline map to match a size and shape of corresponding exposure fields of the production map; and
a model configured to update parameters of a lithography tool based on the final production map.

11. The system according to claim 10, further comprising:
the lithography tool configured to transfer a reference pattern to exposure fields of the reference workpiece to form the pairs of reference features, and further configured to transfer a production pattern to exposure fields of the production workpiece to form the pairs of production features; and
one or more metrology tools configured to measure misalignment of the pairs of reference features to form the first and second baseline maps, and to measure misalignment of the pairs of production features to form the production map.

12. The system according to claim 11, wherein the lithography tool is an immersion lithography tool.

13. The system according to claim 11, wherein the lithography tool and the one or more metrology tools are configured to:
form the first baseline map immediately after performing preventive maintenance (PM) on the lithography tool;
form the second baseline map after forming the first baseline map, before performing PM again on the lithography tool; and
form the production map immediately after performing PM on the lithography tool.

14. The system according to claim 11, wherein the one or more metrology tools are further configured to:
measure lateral displacements between the reference features of the pairs of reference features; and
form the first or second baseline maps mapping locations of the pairs of reference features to the lateral displacements.

15. The system according to claim 10, wherein adding the transformed exposure fields to the production map comprises:
adding displacement vectors of the transformed exposure fields to corresponding displacement vectors in the production map.

16. The system according to claim 10, wherein the model is further configured to determine values of the parameters that compensate for misalignment described by the final production map.

17. The system according to claim 10, wherein the production map describes misalignment immediately after performing preventative maintenance (PM) on the lithography tool, wherein the one or more memory elements further comprise an additional production map describing misalignment after the production map, before performing PM again on the lithography tool, and wherein the system further comprises a verification module configured to:
- determine a Δ production map as a difference between the production map and the additional production map;
- compare the Δ production map to a transformed Δ baseline map comprising the transformed exposure fields; and
- conditionally generate an alarm based on the comparison.

18. The system according to claim 10, further comprising:
- one or more processing units comprising the integration module.

19. A method for process control of a lithography tool, comprising:
- receiving first and second baseline maps respectively describing misalignment of same pairs of reference features distributed across a reference workpiece;
- determining a Δ baseline map as a difference between the first and second baseline maps;
- receiving a production map describing misalignment of pairs of production features distributed across a production workpiece; and
- individually transforming exposure fields of the Δ baseline map to corresponding exposure fields of the production map, and subsequently adding the transformed exposure fields to the production map, to form a final production map.

20. The method of claim 19,
- wherein the first baseline map is formed immediately after performing preventive maintenance (PM) on the lithography tool, the second baseline map is formed after forming the first baseline map and before performing PM again on the lithography tool;
- wherein the production map is formed immediately after performing PM on the lithography tool.

* * * * *